(12) United States Patent
Lee

(10) Patent No.: US 9,000,592 B1
(45) Date of Patent: Apr. 7, 2015

(54) DISPLAY DEVICE AND METHOD OF FABRICATING THE SAME

(71) Applicant: LG Display Co., Ltd., Seoul (KR)

(72) Inventor: YoungHak Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/341,564

(22) Filed: Jul. 25, 2014

(30) Foreign Application Priority Data

May 2, 2014 (KR) .................. 10-2014-0053168

(51) Int. Cl.
*H01L 29/10* (2006.01)
*H01L 29/18* (2006.01)
*H01L 33/00* (2010.01)
*H01L 21/84* (2006.01)
*H01L 27/12* (2006.01)
*H01L 23/485* (2006.01)

(52) U.S. Cl.
CPC ........ *H01L 27/1244* (2013.01); *H01L 27/1225* (2013.01); *H01L 27/127* (2013.01); *H01L 27/124* (2013.01); *H01L 23/485* (2013.01)

(58) Field of Classification Search
CPC .................... H01L 27/1244; H01L 23/53204
See application file for complete search history.

(56) References Cited

U.S. PATENT DOCUMENTS

| | | | |
|---|---|---|---|
| 8,912,544 B2 * | 12/2014 | Yamazaki et al. | 257/59 |
| 2007/0034879 A1 * | 2/2007 | Park et al. | 257/72 |
| 2012/0305911 A1 * | 12/2012 | Iwasaka et al. | 257/43 |
| 2013/0056726 A1 * | 3/2013 | Chae et al. | 257/43 |
| 2013/0214299 A1 * | 8/2013 | Ryu et al. | 257/88 |

\* cited by examiner

*Primary Examiner* — Daniel Luke
(74) *Attorney, Agent, or Firm* — Fenwick & West LLP

(57) ABSTRACT

Disclosed are a display device and a method of fabricating the same. A pad for a display device includes: an oxide semiconductor layer formed on a substrate; a lower insulation layer formed on the oxide semiconductor layer to at least partially overlap the oxide semiconductor layer; one or more line layers formed on the lower insulation layer; an upper insulation layer formed on the one or more line layers; and a pad electrode formed on the upper insulation layer and connected to the one or more line layers through a contact hole formed in the upper insulation layer.

26 Claims, 25 Drawing Sheets

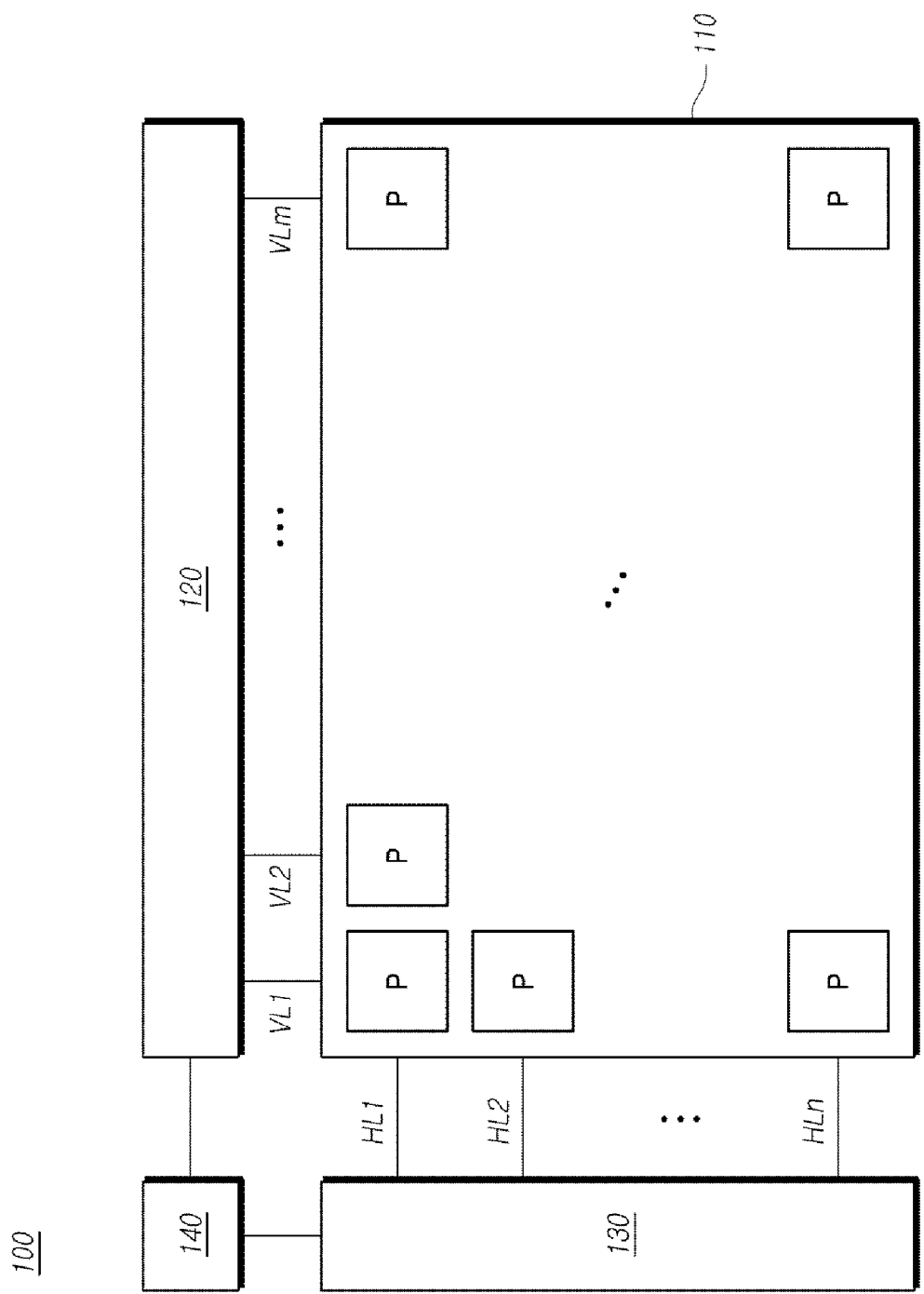

FIG.4
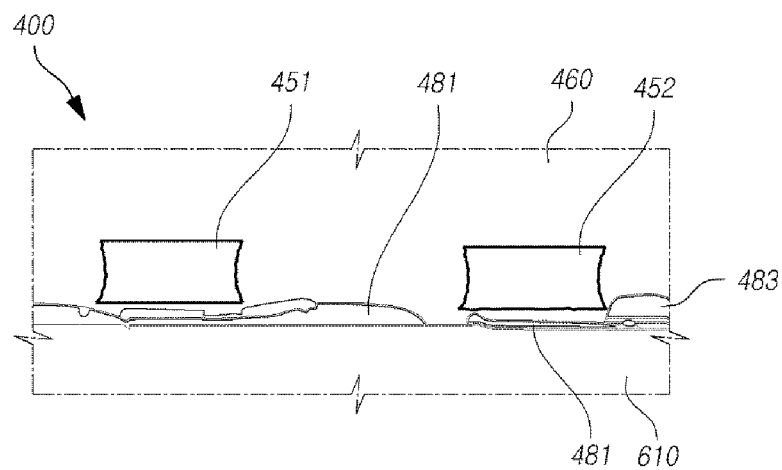
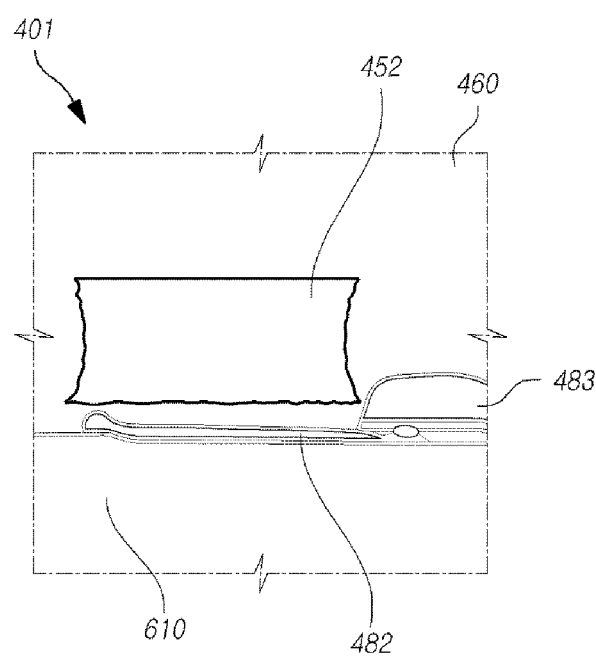

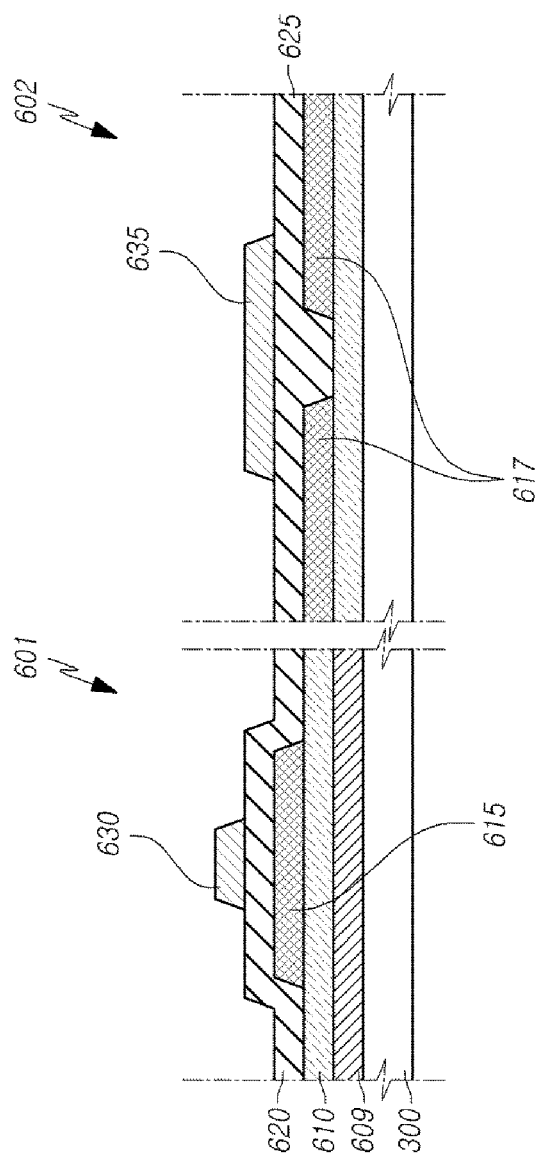

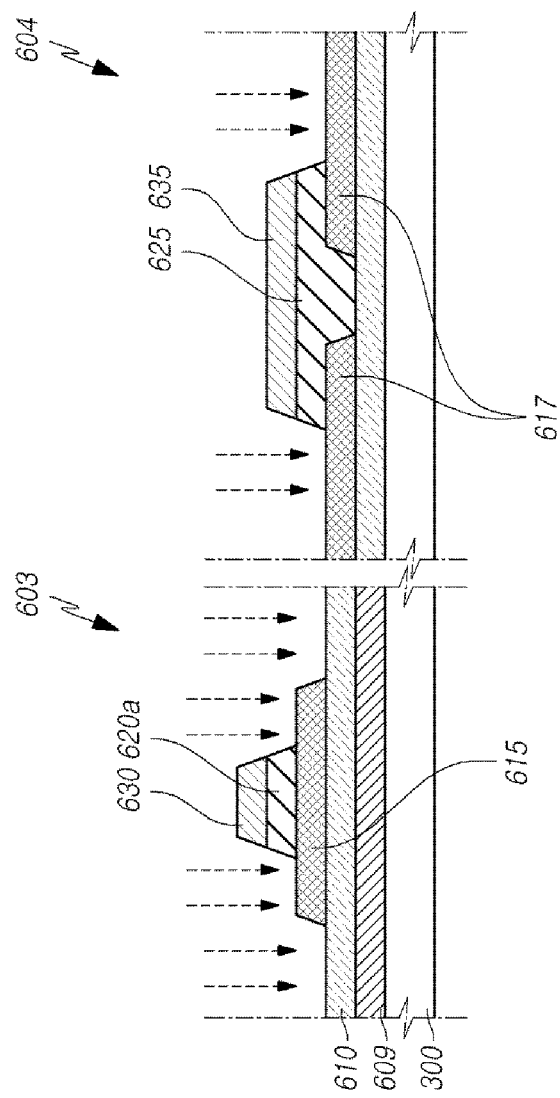

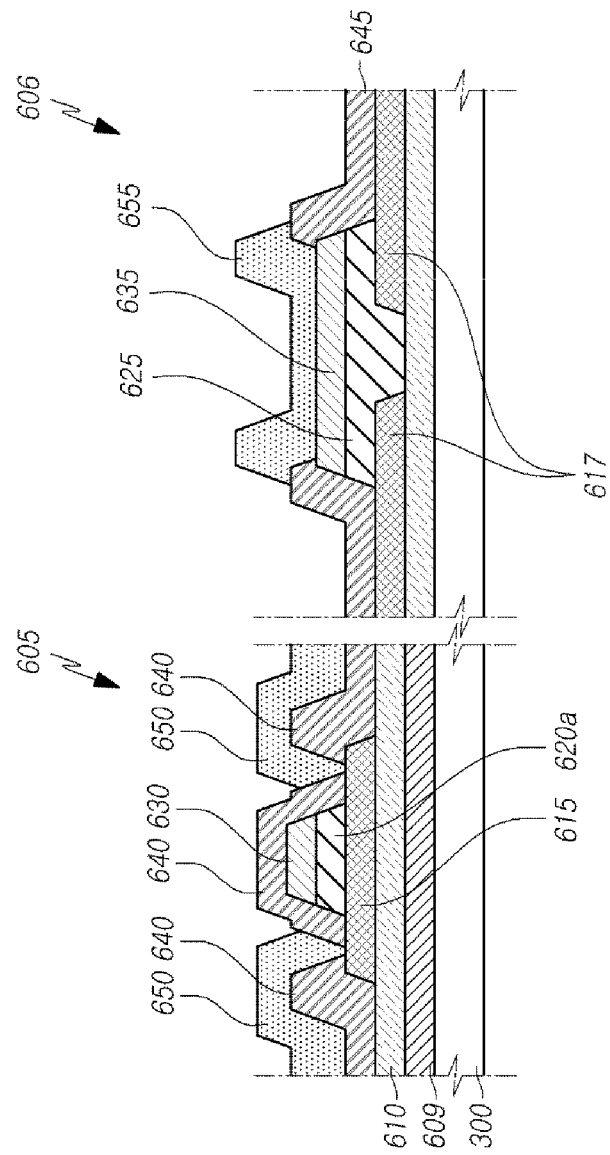

DISPLAY DEVICE AND METHOD OF FABRICATING THE SAME

CROSS-REFERENCE TO RELATED APPLICATION

This application claims priority under 35 U.S.C. §119(a) to Korean Patent Application No. 10-2014-0053168, filed on May 2, 2014, which is incorporated by reference herein.

BACKGROUND OF THE INVENTION

1. Field of the Invention

The present invention relates to a display device and a method of fabricating the display device.

2. Description of the Prior Art

With the development of information society, requirements for display devices are evolving. Currently, commonly used display devices include devices such as a Liquid Crystal Display (LCD), a Plasma Display Panel (PDP), and an Organic Light Emitting Display Device (OLED). These display devices each include a display panel.

The display panel included in the display device may be one of several display panels that are manufactured together on a single substrate. That is, according to various manufacturing processes, devices components, signal lines, electric power lines, and other components for creating image pixels are formed on a single substrate having multiple individual display panel units. Then, the substrate is cut into the individual units of the display panel by using scribe equipment.

Further, the panel includes a display area in which organic light emitting devices, liquid crystals, and the like, are arranged, and a non-display area in which a plurality of pads is formed. The display area and the non-display area may be formed by an identical process, or a related process.

Since materials which are coated in the process of forming a pad are not identical with those coated in the display area, there are materials which are coated in the pixel region that are not coated on the formed pad. Thereby, a problem which does not occur in the display area may occur in the pad area. For example, an adhesion property between the coated materials may become degraded, thereby causing thermalization of the pad area, or increased resistance in the pad area. Material may be added through a separate process independently of the process of forming display area in attempt to solve the problem. However, with this approach, there is still a problem in that the efficiency and accuracy of the display device are lowered in comparison with the manufacturing cost.

SUMMARY OF THE INVENTION

The present invention has been developed to solve the problems in the conventional art, and an aspect of the present invention is to provide a display device and a method of fabricating the same, which includes a pad on which an oxide semiconductor layer is formed to reduce a gap between a buffer layer and an insulation layer laminated on the pad.

In accordance with an aspect of the present invention, a pad is provided for a display device comprising a display area and a pad area, the pad to connect a gate line and a data line from one or more drivers to display elements in the pixel area. The pad includes: an oxide semiconductor layer formed on a substrate; a lower insulation layer formed on the oxide semiconductor layer to at least partially overlap the oxide semiconductor layer; one or more line layers formed on the lower insulation layer; an upper insulation layer formed on the one or more line layers; and a pad electrode formed on the upper insulation layer and connected to the one or more line layers through a contact hole formed in the upper insulation layer.

In accordance with another aspect of the present invention, a display device is provided. The display device includes: a display area in which a pixel area is defined on a substrate by an intersection of a gate line transferring a gate signal and a data line transferring a data signal; a first pad unit including at least two first pads formed in a first area out of the display area, each of the at least two first pads connected to the gate line; and a second pad unit including at least two second pads formed in a second area out of the display area, each of the at least two second pads connected to the data line, wherein at least one of the first and second pad units includes an oxide semiconductor layer formed on the substrate, a lower insulation layer formed on the oxide semiconductor layer, and at least partially overlapping the oxide semiconductor layer, one or more line layers formed on the lower insulation layer, an upper insulation layer formed on the one or more line layers, and a pad electrode formed on the upper insulation layer and connected to one of the one or more line layers through a contact hole formed in the upper insulation layer.

In accordance with still another aspect of the present invention, a display device is provided. The display device includes: a display area in which a pixel area is defined on a substrate by an intersection of a gate line transferring a gate signal and a data line transferring a data signal, the pixel area comprising a pixel electrode; a first pad unit including at least two first pads formed in a first area of the display area, each of the at least two first pads connected to the gate line; and a second pad unit including at least two second pads formed in a second area of the display area, each of the at least two second pads connected to the data line, wherein at least one of the first and second pads includes a pad electrode formed of a same material as the pixel electrode, and wherein an oxide semiconductor layer is formed over an area of the substrate laterally between the at least two first pads or the at least two second pads.

In accordance with still another aspect of the present invention, a method of fabricating a pad of a display device is provided, the pad to connect a gate line and a data line from one or more drivers to display elements in a pixel area of the display device. The method includes: forming an oxide semiconductor layer over a substrate; forming a lower insulation layer on the oxide semiconductor layer to at least partially overlap the oxide semiconductor layer; forming one or more line layers on the lower insulation layer; forming an upper insulation layer on the one or more line layers; forming a contact hole through the upper insulation layer; and forming a pad electrode on the upper insulation layer so that the pad electrode is connected to the one or more line layers through the contact hole.

In accordance with still another aspect of the present invention, a display device is provided comprising: a substrate; a buffer layer formed over the substrate; a plurality of pixel layers formed in a pixel area over a first portion of the buffer layer, the plurality of pixel layers including: an active layer formed on the buffer layer in the pixel area; a gate insulation layer formed on the active layer in the pixel area; an interlayer dielectric layer formed on the gate line in the pixel area; a source/drain layer connected with a data line formed on the interlayer dielectric layer in the pixel area; a planarization layer formed on the source/drain layer in the pixel area; and a pixel electrode formed on the planarization layer in the pixel area; a plurality of pad layers formed in a pad area over a second portion of the buffer layer, the plurality of pad layers including: an oxide semiconductor layer formed on the buffer layer in the pad area, the oxide semiconductor layer formed of a same material as the active layer; a data line layer formed over the oxide semiconductor layer in the pad area, the data line layer formed of a same material as the data line; an upper insulation layer formed over the line layer in the pad area, the upper insulation layer formed of a same material as the planarization layer; and a pad electrode formed on the third insulation layer in the pad area, the pad electrode formed of a same material as the pixel electrode.

As described above, according to the present invention, there is provided the display panel including the pad on which the oxide semiconductor layer for reducing the gap between the buffer layer and the insulation layer laminated on the pad is formed.

BRIEF DESCRIPTION OF THE DRAWINGS

The above and other aspects, features, and advantages of the present invention will be more apparent from the following detailed description taken in conjunction with the accompanying drawings, in which:

FIG. 1 is a schematic view showing a display device according to an embodiment of the present invention;

FIG. 4 is a view showing a gap in the pad;

FIGS. 6A, 6B, 6C, and 6D are sectional views illustrating processes of forming an oxide semiconductor layer on a buffer layer according to the embodiment of the present invention;

DETAILED DESCRIPTION OF THE EXEMPLARY EMBODIMENTS

Figure 2A:
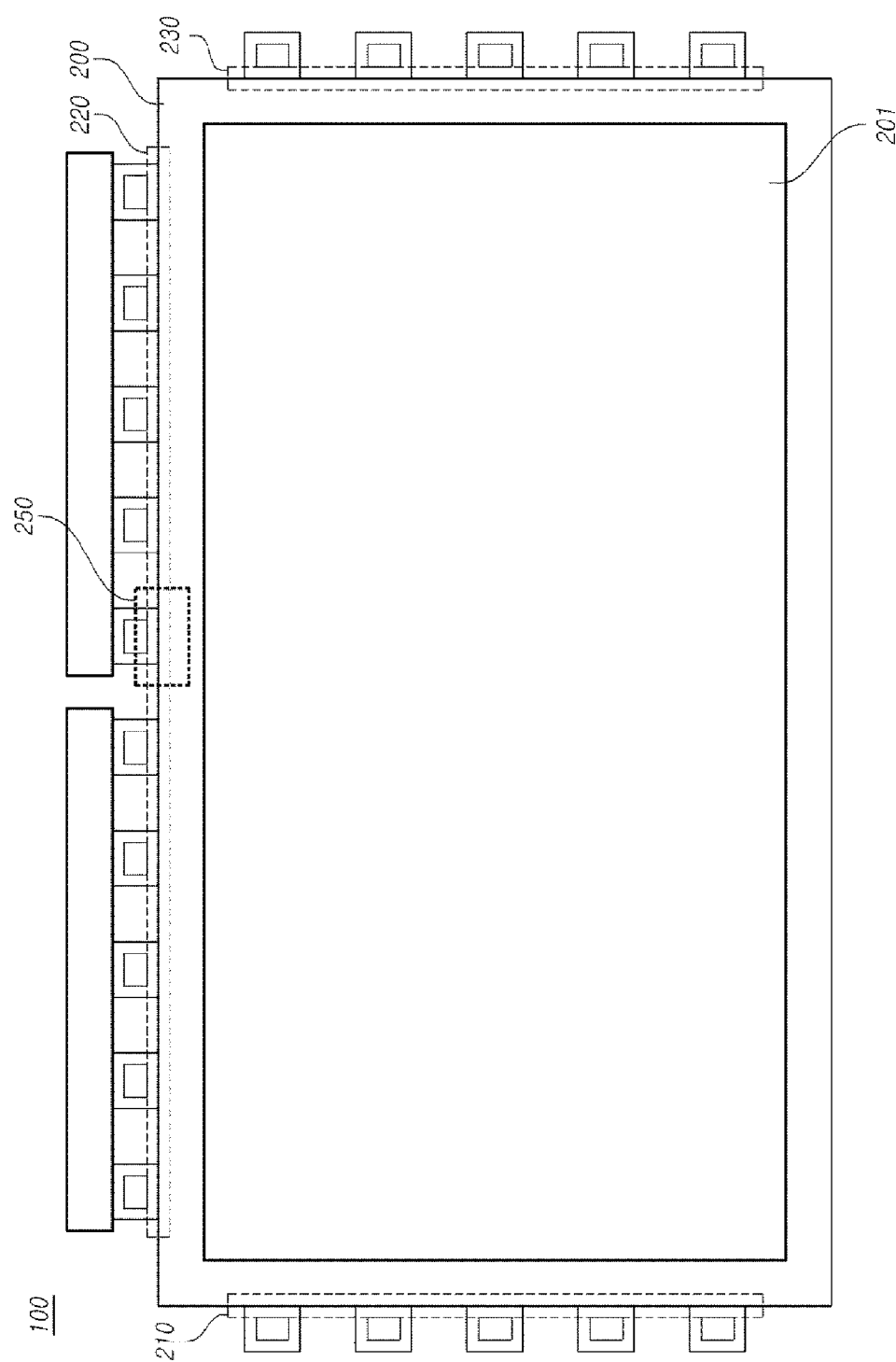
FIGS. 2A and 2B are views showing the display device including a pad unit to which the embodiment of the present invention is applied.

Hereinafter, exemplary embodiments of the present invention will be described with reference to the accompanying drawings. In the following description, the same elements will be designated by the same reference numerals although they are shown in different drawings. Further, in the following description of the present invention, a detailed description of known functions and configurations incorporated herein will be omitted when it may make the subject matter of the present invention less clear.

In addition, terms, such as first, second, A, B, (a), (b) or the like may be used herein when describing components of the present invention. Each of these terminologies is not necessarily used to define an essence, order or sequence of a corresponding component but used merely to distinguish the corresponding component from other component(s). It should be noted that if it is described in the specification that one component is "connected", "coupled" or "joined" to another component, a third component may be "interposed" between the first and second components, although the first component may be directly "connected", "coupled" or "joined" to the second component.

FIG. 1 is a schematic view showing a display device according to an embodiment of the present invention.

Referring to FIG. 1, the display device 100 according to the embodiment of the present invention includes: a display panel 110 in which a plurality of first lines VL1 to VLm are formed in a first direction, e.g., a vertical direction, and a plurality of second lines HL1 to HLn are formed in a second direction, e.g., a horizontal direction; a first driving unit 120 for supplying a first signal to the plurality of first lines VL1 to VLm; a second driving unit 130 for supplying a second signal to the plurality of second lines HL1 to HLn; and, a timing controller 140 for controlling the first driving unit 120 and the second driving unit 130.

A plurality of pixels P are defined in the display panel 110 at locations where the plurality of first lines VL1 to VLm formed in the first direction (e.g., a vertical direction), and the plurality of second lines HL1 to HLn formed in the second direction (e.g., a horizontal direction), cross each other.

The above-mentioned first driving unit 120 and second driving unit 130 may include at least one driver integrated circuit (IC) outputting a signal for displaying an image.

The plurality of first lines VL1 to VLm formed on the display panel 100 in the first direction may be, for example, data lines formed in the vertical direction (first direction), for transferring a data voltage (first signal) to vertical rows of pixels, and the first driving unit 120 may be a data driving unit for supplying a data voltage to the data lines.

The plurality of second lines HL1 to HLn, formed in the display panel 110 in the second direction, may be gate lines formed in the horizontal direction (second direction), for transferring a scan signal (first signal) to horizontal rows of pixels, and the second driving unit 130 may be a gate driving unit for supplying a scan signal to the gate lines.

Further, the display panel 110 has a pad unit configured to contact the first driving unit 120 and the second driving unit 130. The pad unit transfers the first signal to the display panel 110 when the first driving unit 120 supplies the first signal to the plurality of the first lines VL1 to VLm, and also transfers the second signal to the display panel 110 when the second driving unit 130 supplies the second signal to the plurality of the second lines HL1 to HLn. Accordingly, in a process of forming a pixel area on the display panel 110, the pad is formed together with the pixel area.

FIG. 2A is a view showing the display device including the pad unit to which the embodiment of the present invention is applied.

The display panel 110 of the display device 100 of FIG. 1 is divided into a display area 201 and a pad area 200, and the pad area 200 has a plurality of pad units 210, 220 and 230. The display panel is connected to each driver IC at upper, lower, left, and right ends of the display area 201. The pad units 210, 220, and 230 include a plurality of pads having a pad electrode to which the driver IC may be connected.

Figure 2B:
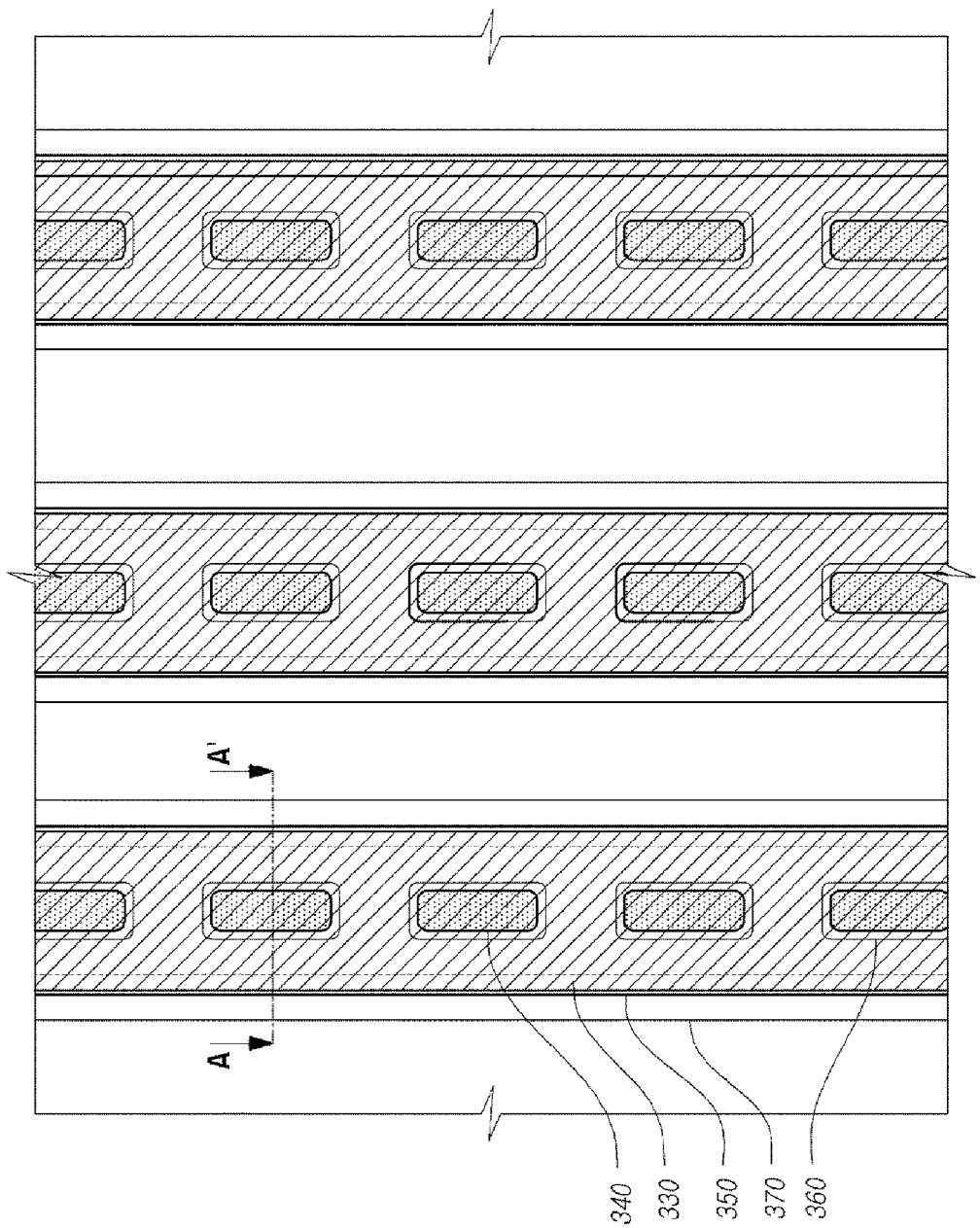

A reference numeral 250 is a part of the pad unit, which includes a plurality of pads. The configuration of a plurality of pads is shown in FIG. 2B.

In one embodiment, an oxide thin film transistor having a coplanar structure may be used as one scheme of forming a thin film transistor of the display panel. Furthermore, a process of forming a thin film transistor of the display panel and a process of forming the pad are performed together.

The oxide thin film transistor in which an amorphous zinc oxide based semiconductor is used as an active layer may have a coplanar structure in which a gate electrode and a source/drain electrode are arranged on the active layer.

The oxide thin film transistor advantageously enables high mobility and satisfies a constant current test, and has an even characteristic so as to be applicable to a large area display since the active layer is formed by using the amorphous zinc oxide based semiconductor. A zinc oxide (ZnO) is a substance capable of implementing conductivity, semiconductor characteristic, and resistance according to contained quantity of oxygen, and the oxide thin film transistor to which the amorphous zinc oxide based semiconductor substance is applied as the active layer may be applicable to the large area display, including the liquid crystal display device and the organic light emitting diode device. Further, interest and research in a transparent electronic circuit has been recently increasing. Since the oxide thin film transistor to which the amorphous zinc oxide based semiconductor substance is applied as the active layer has high mobility and may be fabricated at a low temperature, the amorphous zinc oxide based semiconductor substance may advantageously be used in the transparent electrode circuit. In the oxide thin film transistor according to the embodiment of the present invention, an amorphous IGZO semiconductor containing a heavy metal, such as indium In and gallium Ga, in the ZnO may be formed as the active layer. The a-IGZO semiconductor is transparent to allow a visible ray to pass through, and also the oxide thin film transistor made of the a-IGZO semiconductor has a mobility of 1~100 cm/Vs and has a higher mobility than an amorphous silicon thin film transistor. Further, the a-IGZO semiconductor has a wide band gap and may be used to manufacture an ultraviolet light emitting diode (UV-LED), a white LED, and other parts, which have high color purity. Further, it is possible to manufacture the a-IGZO semiconductor at a low temperature, thereby producing light and flexible products. Further, since the oxide thin film transistor made of the a-IGZO semiconductor has a similar characteristic to the amorphous silicon thin film transistor, the oxide thin film transistor has a simple structure like the amorphous silicon thin film transistor and may be applicable to the large area display.

Herein, the oxide semiconductor may be one of a Zinc oxide (ZnO) semiconductor, an Indium Zinc oxide (IZO) semiconductor, an Indium Aluminum Zinc oxide (IAZO) semiconductor, an Indium Gallium Zinc oxide (IGZO) semiconductor, or an Indium Tin Zinc oxide (ITZO) semiconductor, but is not limited thereto.

FIG. 2B is an enlarged view showing the pad unit to which the embodiment of the present invention is applicable.

FIG. 2B is an enlarged view illustrating the pad unit marked by a reference numeral 250 of FIG. 2A. The pad unit has a plurality of pads formed therein. Each pad includes a first line layer 330 formed along with a gate line, a second insulation layer 340 formed along with an interlayer insulation layer, a second line layer 350 simultaneously formed along with the data line, a third insulation layer 360 formed along with a planarization layer on the second line layer 350, and a pad electrode 370 simultaneously formed along with a pixel electrode.

Figure 3:
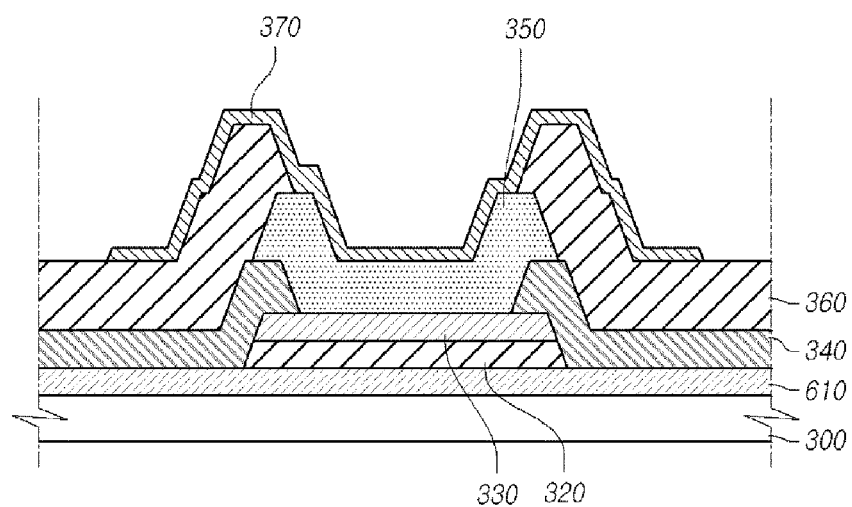
FIG. 3 is an enlarged view showing a pad including a pad electrode.

FIG. 3 is an enlarged view showing the pad including a pad electrode. FIG. 3 is a sectional view illustrating the pad unit, taken along a line A-A' of FIG. 2B. In the case that the display area is formed of the oxide thin film transistor having a coplanar structure, a cross section of the pad formed in the pad area is shown. In the process of fabricating the display device, the display area of the display panel is formed and simultaneously the pad area may be formed. That is, a substance forming a gate line of the display area, a substance forming a source/drain, and a substance forming a pixel electrode are laminated, so as to form the pad in the pad area. FIG. 3 shows enlarged pads configuring the pad units 210, 220, and 230 of the pad area 200 in the display device 100 of FIG. 2.

The buffer layer 610 is laminated on the substrate 300. Then, the first insulation layer 320 is formed along with the gate insulation layer, and the first line layer 330 is simultaneously formed along with the gate line on the first insulation layer 320. Next, the second insulation layer 340 is formed along with the interlayer insulation layer. Continuously, a contact hole connecting to the first line layer 330 is etched, and then the second line layer 350 is simultaneously formed along with the data line through the contact hole. After the third insulation layer 360 is formed along with a planarization layer on the second line layer 350, the contact hole is etched in order to connect the contact hole to the second line layer 350, and the pad electrode 370 is simultaneously formed along with the pixel electrode through the contact hole.

However, in the pad of FIG. 3, an interface of the buffer layer 610 may become unstable from the process of etching the first insulation layer 320 after the buffer layer 610 is formed.

If the interface of the pad is unstable, a gap is generated and causes an increase in resistance. As a result, resistance against a connection of the panel with an external IC increases, and heating and thermalization in an area in which the resistance increases may cause a defect of the pad. For example, if the organic light emitting display device is driven by a current driving scheme, a defect in the pad may occur due to the heating and the thermalization in the area in which the resistance increases.

FIG. 4 is a view showing a gap in the pad. A reference numeral 400 denotes the pad in which the gap is generated on the buffer layer. Line layers 451 and 452 are formed on the buffer layer 610 in the pad 400. A reference numeral 401 denotes an enlarged portion of the pad 400. The gaps 482 and 483 are formed between the insulation layer 460 and the buffer layer 610.

In FIG. 4, the reason for the generation of the gap is because the interface between the interlayer dielectric (ILD) layer and the buffer layer is unstable. In the coplanar process, a gate metal is masked to etch a gate insulation layer after a gate is formed, and conduction of the active layer is performed. In the process of etching the gate insulation layer of the pad unit, the gate insulation layer is etched, and the interlayer dielectric layer and the buffer layer are joined. In this process, the interface becomes unstable.

Figure 5A:
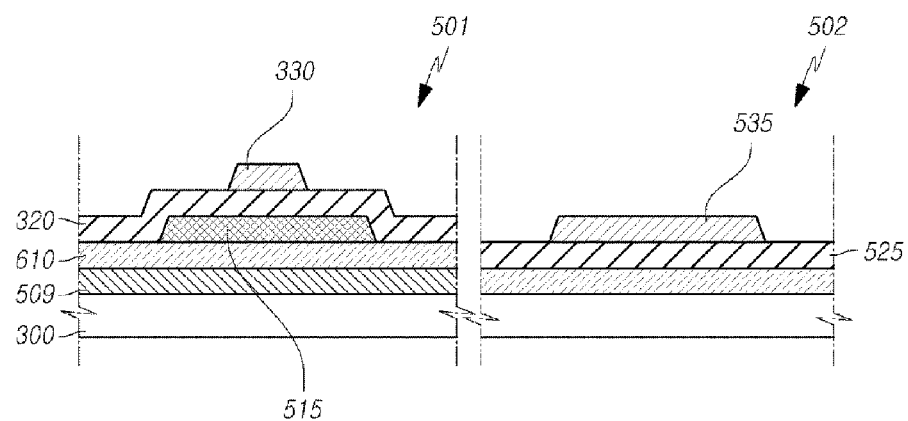
FIGS. 5A, 5B, and 5C are sectional views illustrating processes of simultaneously forming a display area and the pad.
Figure 5B:
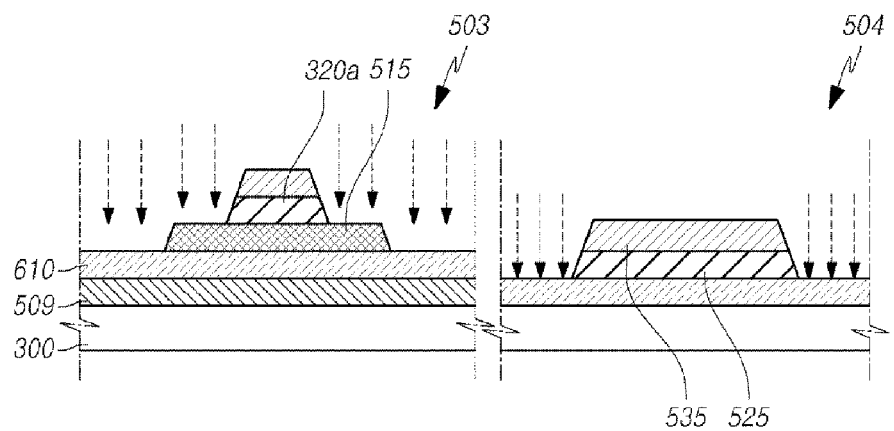
Figure 5C:
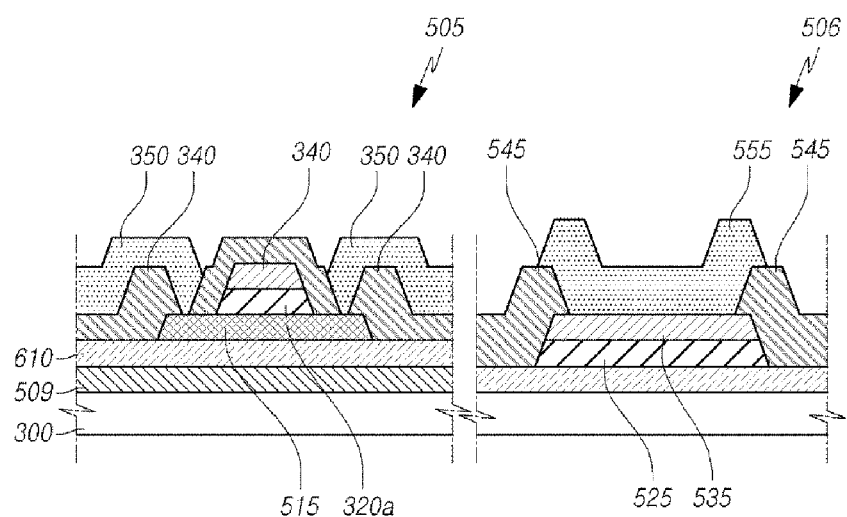

FIGS. 5A, 5B, and 5C are sectional views illustrating processes of simultaneously forming the display area and the pad.

A reference numeral 501 of FIG. 5A denotes the display area in which a light shield layer 509, the buffer layer 610, the active layer 515, the gate insulation layer 320, and the gate line 330 are formed on the substrate 300. A reference numeral 502 denotes a pad formed in the panel area in the same process as forming the display area 501.

FIG. 5B shows the sectional view illustrating the gate insulation layer 320a and the active layer 515 in the conductive process, in which a reference numeral 503 denotes a partially formed display area including the gate insulation layer 320a, which is etched, and the active layer 515. A reference numeral 504 indicates a partially formed pad area including a first insulation layer 525, which is etched. As an example, a dry etching process is performed to over etch and then a conducting process is carried out by a helium plasma treatment to make exposed areas of the active layer 515 conductive. In these processes, a problem may occur if the interface of the buffer layer 610 becomes unstable.

FIG. 5c shows a process of forming a source/drain, in which a reference numeral 505 indicates a partially formed display area in which the interlayer dielectric layer 340 is formed and then the source/drain 350 is formed along with the data line. Similarly, a reference numeral 506 indicates a partially formed pad area in which a second insulation layer 545 is formed along with the interlayer dielectric layer 340, and a second line layer 555 is formed on the second insulation layer 545 in the same process as the process of forming the data line. In this process, the interface of the buffer layer 610 becomes unstable, and as a result, a gap is formed between the second insulation layer 545 and the buffer layer 610.

In order to prevent a generation of the gap between the insulation layer and the buffer layer due to instability of the interface in the process of etching the gate insulation layer, a separate oxide semiconductor layer is formed on the buffer layer, so as to minimize the instability of the interface of the buffer layer due to the etching. The oxide semiconductor layer configures the active layer 515 in the display areas 501, 503, and 505 of FIGS. 5A, 5B, and 5C.

FIGS. 6A, 6B, 6C, and 6D are sectional views illustrating processes of forming the oxide semiconductor layer on the buffer layer according to the embodiment of the present invention.

A reference numeral 601 of FIG. 6A denotes the panel area in which a light shield layer 609, a buffer layer 610, an active layer 615, a gate insulation layer 620, and a gate line 630 are formed on the substrate 300. A reference numeral 602 indicates a pad area in which a pad is formed on the substrate in the same process as forming the panel area 601. Here, an oxide semiconductor layer 617 is formed on the buffer layer 610 in the same process as forming the active layer 615, a first insulation layer 625 is formed on the oxide semiconductor layer 617 in the same process as forming the gate insulation layer 620, and a first line layer 635 is formed in the same process as forming the gate line 630. In FIG. 6A, differently from FIG. 5A, the oxide semiconductor layer 617 is formed on the pad by using the same material as that of the active layer 615 in the same process as forming the active layer 615 in the display area.

FIG. 6B shows a process corresponding to the etching of the gate insulation layer and the conducting of the active layer in the panel area. In the process of forming the display area 603, the gate insulation layer 620a is etched and the active layer 615 is made conductive. In the process of forming the pad area 604, the first insulation layer 625 made of the same material as that of the gate insulation layer 620a is etched. As an example, a dry etching process is performed to over-etch and then a conducting process is carried out by a helium plasma treatment to make the exposed area of the active layer 615 conductive.

Since the oxide semiconductor layer 617 is formed on the buffer layer 610 on the pad 604, instability of the interface can be reduced in the etching and the plasma treating process.

FIG. 6C shows an partially formed device after at an intermediate processing step of forming the source/drain in the display area using the data line. In the partially formed display area 605, an interlayer dielectric layer 640 is formed and then the source/drain 650 is formed along with the data line. In the partially formed pad area 606, a second insulation layer 645 is formed and etched in the same process as forming the interlayer dielectric layer 640, and the second line layer 655 is formed on an etched portion of the second insulation layer 645 in the same process as forming the data line.

Figure 6D:
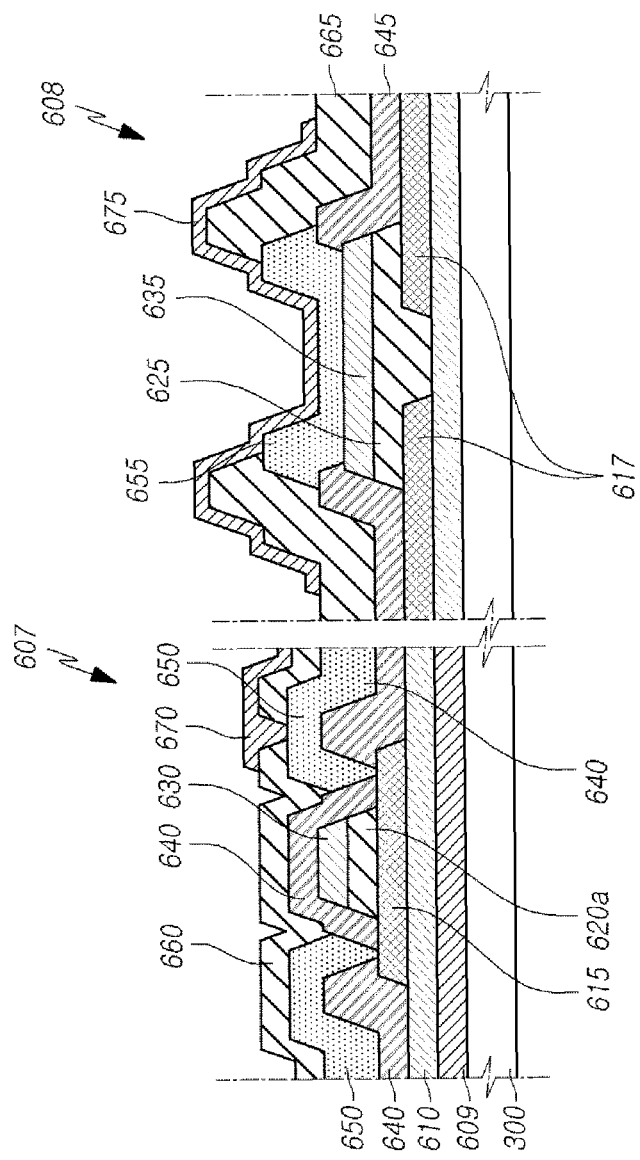

In FIG. 6D, a device after a processing step of forming a planarization layer and a pixel electrode is illustrated. In the display area 607, the planarization layer 660 is formed and a contact hole is formed so that the pixel electrode 670 is connected to the source/drain 650. In the pad area 608, a third insulation layer 665 is formed in the same process as forming the planarization layer 660 (and of the same material) and the contact hole is formed, so as to form the pad electrode 675 in the same process as forming the pixel electrode 670 (and of the same material).

FIGS. 7A, 7B, 7C, and 7D are plane and sectional views illustrating devices at various stages in a process of forming an oxide semiconductor layer in the pad according to the embodiment of the present invention.

Figure 7A:
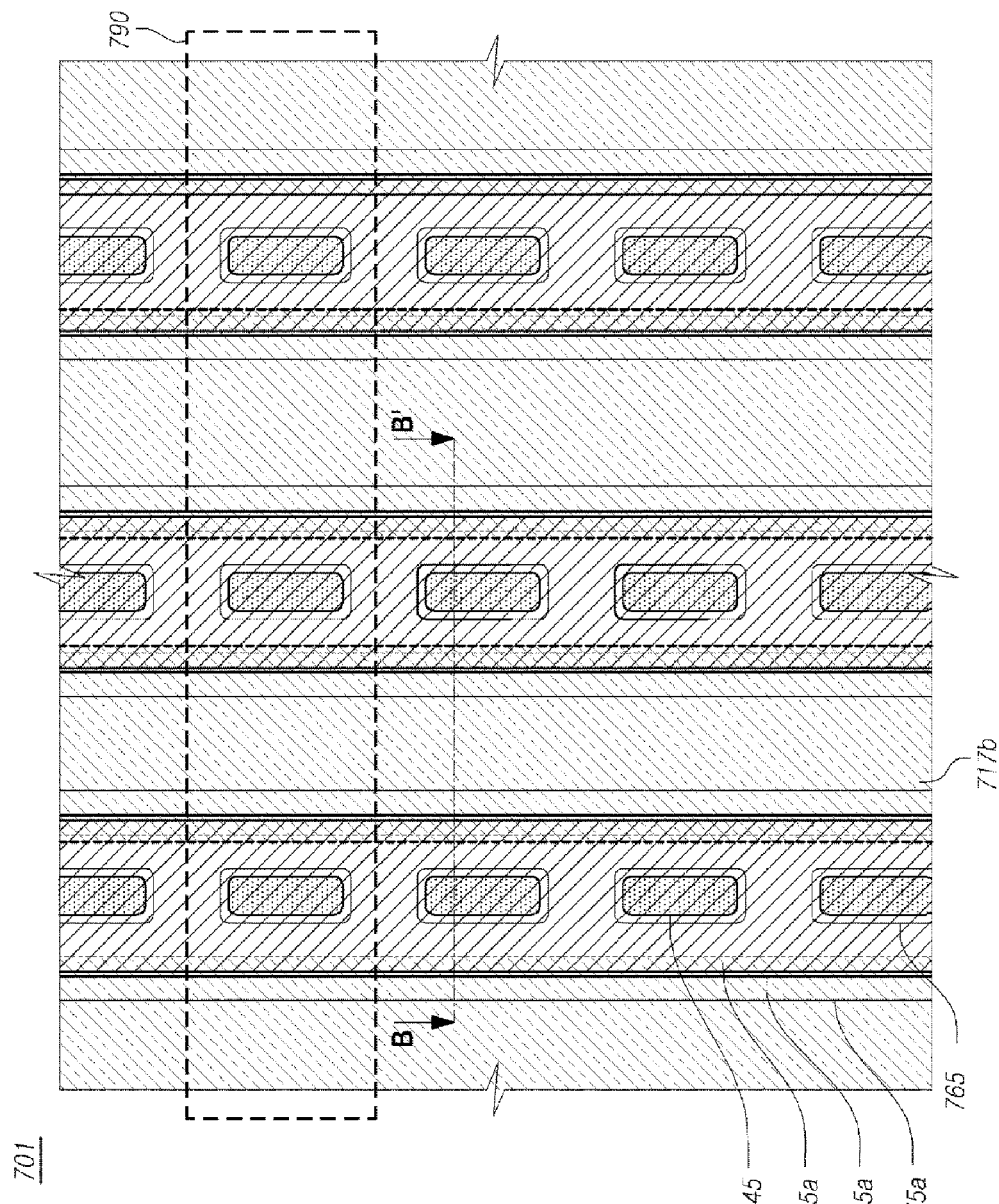
FIGS. 7A, 7B, 7C, and 7D are sectional views illustrating processes of forming an oxide semiconductor layer in the pad according to the embodiment of the present invention.

FIG. 7A is a plane view illustrating the pad on which the oxide semiconductor layer is formed according to the embodiment of the present invention.

A plurality of pads collectively forms a pad unit 701. An oxide semiconductor layer 717b is formed on the buffer layer in the same process as forming the active layer. Further, a lower insulation layer 725a is formed on the buffer layer and the oxide semiconductor layer 717b to partially or entirely overlap the buffer layer and the oxide semiconductor layer 717b. A first line layer 735a is formed on the lower insulation layer 725a in the same process as forming the gate line. The first upper insulation layer 745 is formed and etched to include the contact hole in the same process as forming the interlayer insulation layer. The second line layer 755a is formed on the contact hole and connected to the first line layer 735a through the contact hole. Then, the second upper insulation layer 765 is formed on the second line layer 755a in the same process as forming the planarization layer. The second upper insulation layer 765 is etched to form the contact hole, and the pad electrode 775a is formed on the contact hole and connected to the second line layer 755a through the contact hole.

Figure 7B:
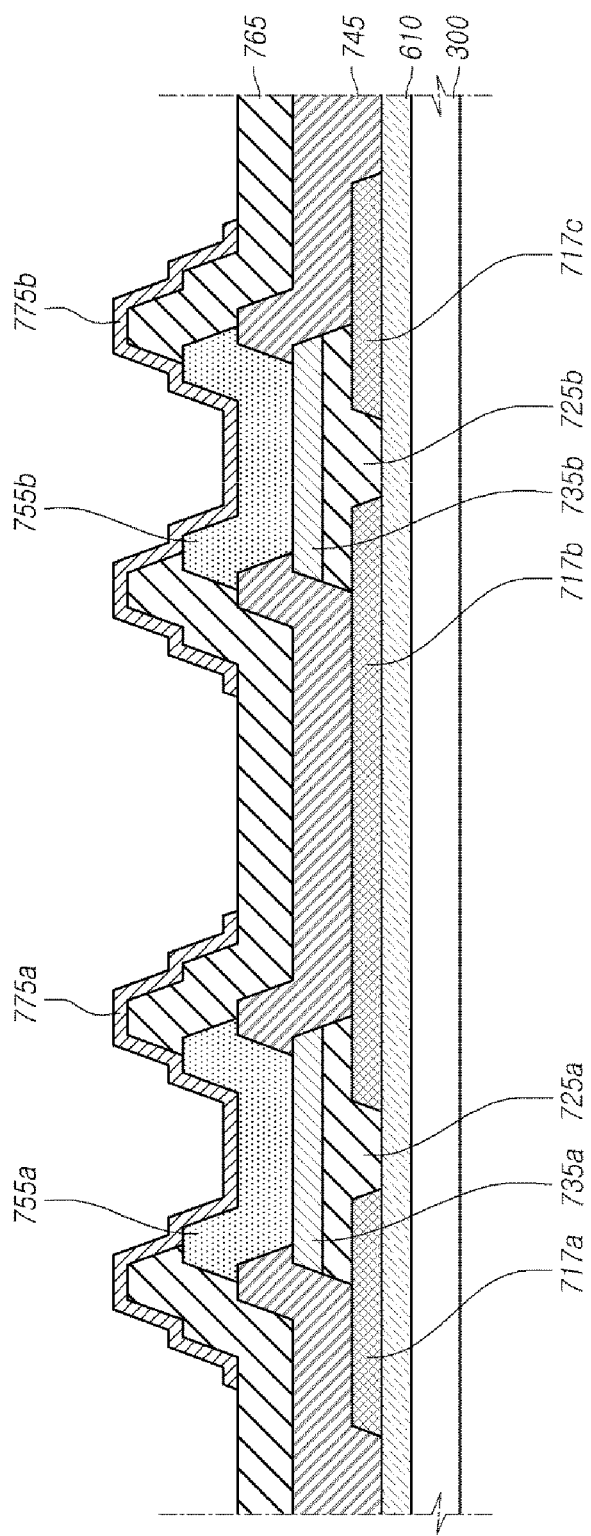

FIG. 7B is a sectional view illustrating a configuration in which the oxide semiconductor layer of the pad unit is formed for a plurality of pads according to the embodiment of the present invention. FIG. 7B shows a sectional view of the pad, taken along a line B-B' of FIG. 7A.

Referring to FIG. 7B, the buffer layer 610 is formed on the substrate 300, and the oxide semiconductor layers 717a, 717b, and 717c are formed in the same process as forming the active layer. The lower insulation layer 725a and 725b are formed on the buffer layer 610 and the oxide semiconductor layers 717a, 717b, and 717c. The lower insulation layers 725a and 725b correspond to the first insulation layer 625 formed in the process of forming the gate insulation layer 620 in FIG. 6a. First line layers 735a and 735b are formed on the lower insulation layers 725a and 725b in the same process as forming the gate line. The first upper insulation layer 745 is formed and etched to include the contact hole in the same process as forming the interlayer dielectric layer, and the second line layers 755a and 755b are formed and connected to the first line layers 735a and 735b through the contact hole. Then, the second upper insulation layer 765 is formed on the second line layers 755a and 755b in the same process as forming the planarization layer. Then, the second upper insulation layer 765 is etched to form the contact hole, and the pad electrodes 775a and 775b are formed through the contact hole.

Figure 7C:
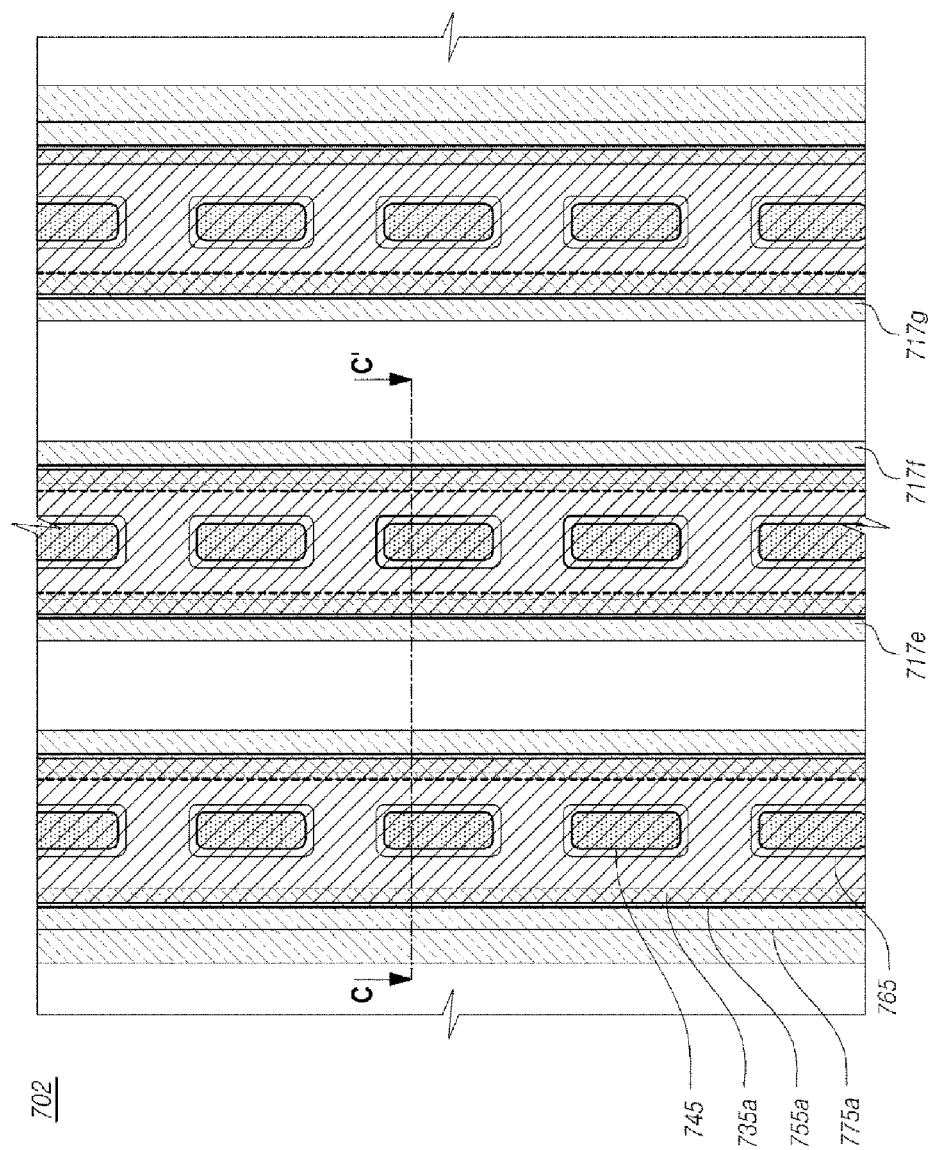

FIG. 7C is a plane view illustrating the pad according to another embodiment of the present invention. A plurality of pads collectively form a pad unit 702, and oxide semiconductor layers 717e, 717f, and 717g are separately formed between the pads, in contrast to the embodiment of FIG. 7A. Other elements of FIG. 7B are similar or identical to FIG. 7A described above.

Figure 7D:
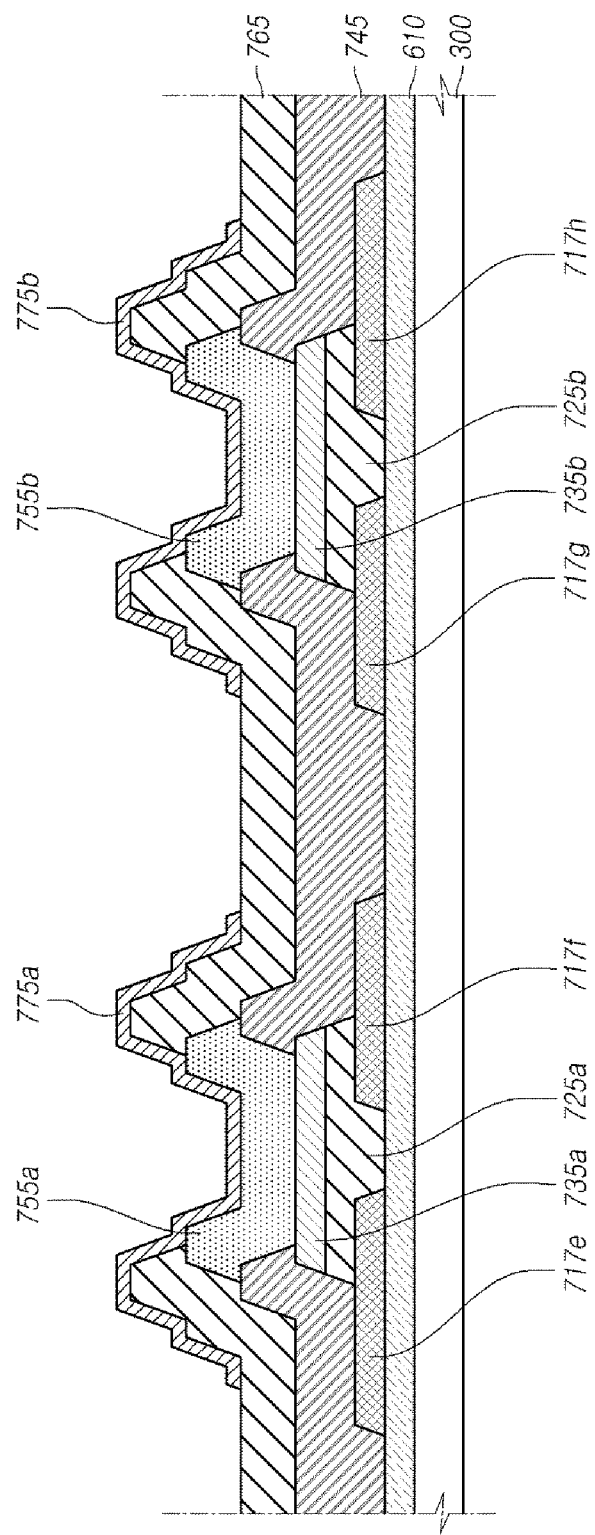

FIG. 7D is a sectional view illustrating an embodiment in which the oxide semiconductor layer of the pad unit is formed with a plurality of pads according to the embodiment of the present invention. FIG. 7D shows a sectional view illustrating the pad, taken along a line C-C' of FIG. 7C.

FIG. 7D has a similar configuration to that of FIG. 7B, except that the oxide semiconductor layers 717*e*, 717*f*, 717*g*, and 717*h* are configured in differently. In FIG. 7D, the oxide semiconductor layers 717*f* and 717*g* comprise two discrete portions that do not contact each other in contrast with the single oxide semiconductor portion 717*b* of FIG. 7B. The discrete portion of the oxide semiconductor layer 717*f*, 717*g* beneficially prevents a short-circuit of the oxide semiconductor layer 717*b* from the first line layers 735*a* and 735*b* when the oxide semiconductor layer 717*b* of FIGS. 7A and 7B is made to be a conductor in the plasma process.

Figure 8:
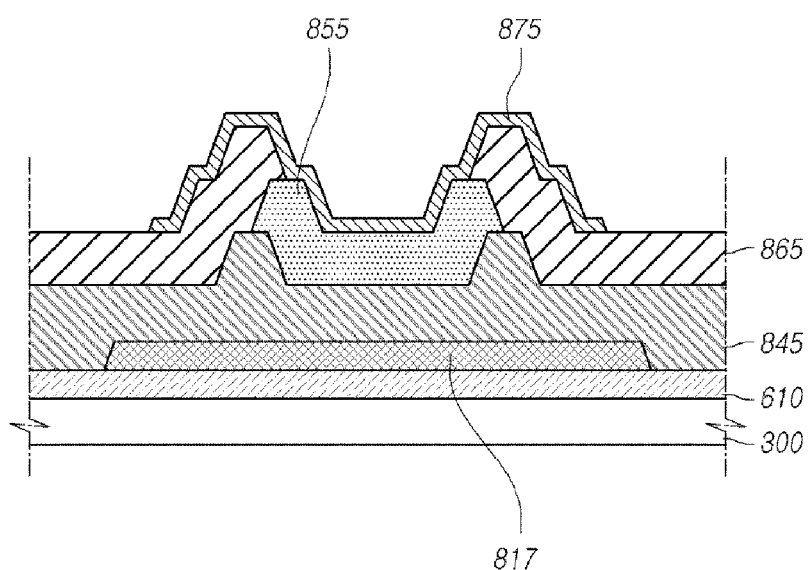
FIG. 8 is a sectional view illustrating a line layer having a single structure according to the embodiment of the present invention.

FIG. 8 is a sectional view illustrating a line layer having a single structure according to still another embodiment of the present invention.

The buffer layer 610 is formed on the substrate 300, and an oxide semiconductor layer 817 is formed on the buffer layer 610 in the same process as forming the active layer. The oxide semiconductor layer 817 may be formed as a single continuous piece as illustrated, or alternatively, a plurality of discrete oxide semiconductor layers 817 that do not contact each other may be separately formed. Further, a lower insulation layer 845 is formed on the buffer layer 610 and the oxide semiconductor layer 817. The lower insulation layer 845 is formed and etched to include a contact hole in the same process as that of forming the interlayer dielectric layer, and a line layer 855 is formed through the contact hole. An upper insulation layer 865 is formed in the same process as forming the planarization layer. Then, the second upper insulation layer 865 is etched to form the contact hole, and the pad electrode 875 is formed through the contact hole.

Figure 9:
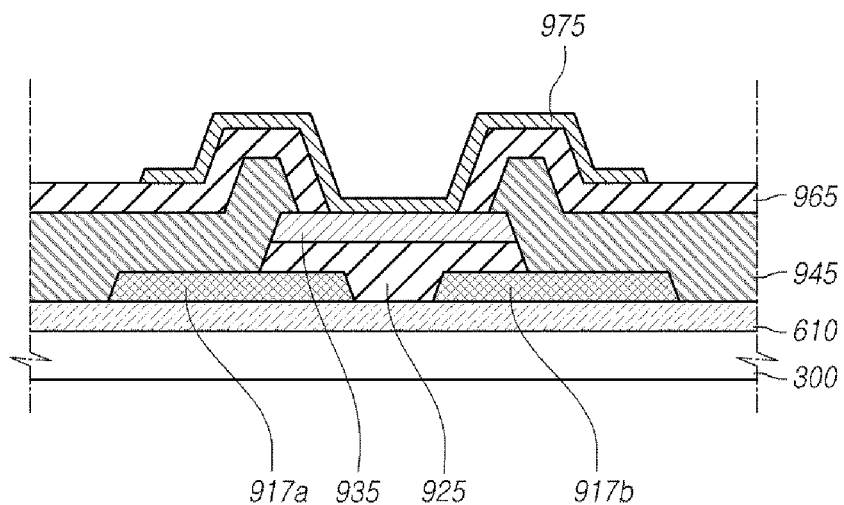
FIG. 9 is a sectional view illustrating a line layer having a single structure according to another embodiment of the present invention.

FIG. 9 is a sectional view illustrating a line layer having a single structure according to another embodiment of the present invention.

The buffer layer 610 is formed on the substrate 300, and oxide semiconductor layers 917*a* and 917*b* are formed on the buffer layer 610 in the same process as forming the active layer. Further, a lower insulation layer 925 is formed on the buffer layer 610 and the oxide semiconductor layers 917*a* and 917*b*. The lower insulation layer 925 corresponds to the first insulation layer 625 formed in the process of forming the gate insulation layer 620 in FIG. 6A. A line layer 935 is formed on the lower insulation layer 925 in the same process as forming the gate line. The first upper insulation layer 945 is formed and etched to include the contact hole in the same process as forming the interlayer dielectric layer. A second upper insulation layer 965 is formed in the same process as forming the planarization layer. Further, the second upper insulation layer 965 is etched to form a contact hole, and a pad electrode 975 is formed through the contact hole and is connected to the line layer 935.

Hereinafter, an embodiment of the pad of the present invention will be described, based on the configuration of FIGS. 6A to 9.

A buffer layer is formed on the substrate, and an oxide semiconductor layer is formed. A lower insulation layer is formed on the oxide semiconductor layer to partially, or entirely, overlap the oxide semiconductor layer. A line layer is formed over the lower insulation layer, on which the upper insulation layer is formed. A pad electrode is formed on the upper insulation layer and connected to the line layer through the contact hole formed on the upper insulation layer.

Here, according to the embodiment shown in FIGS. 6A to 7D, the line layer may include a lower layer formed of a same material as that of a gate line in the display area, and an upper layer formed of a same material as that of a data line. In this case, the lower insulation layer is formed in the same process as forming the gate insulation layer of the display area. Further, the upper insulation layer is divided into the first upper insulation layer and the second upper insulation layer, in which the first upper insulation area is formed in the same process as forming the interlayer dielectric layer of the display area. The second upper insulation layer is formed in the same process as forming the planarization layer of the display area.

Further, according to the embodiment shown in FIG. 8, the line layer has a single layer formed of a same material as that of the data line. In FIG. 8, the lower insulation layer is formed in the same process as forming the interlayer dielectric layer of the display area. The upper insulation layer is formed in the same process as forming the planarization layer of the display area.

Further, according to the embodiment shown in FIG. 9, the line layer has a single layer formed of a same material as that of the data line. In FIG. 9, the lower insulation layer is formed in the same process as forming the gate insulation layer of the display area. The first upper insulation layer is formed in the same process as forming the interlayer dielectric layer of the display area. The second upper insulation layer is formed in the same process as forming the planarization layer of the display area.

The pad electrode is formed of a same material as that of a pixel electrode, which is connected to the line layer through the contact hole formed in the upper insulation layer.

Hereinafter, a display device having the configuration shown in FIGS. 6A to 9 will be described.

The substrate includes a display area and a pad area, and in the display area, a pixel area is defined on the substrate by an intersection of a gate line for transferring a gate signal and a data line for transferring a data signal. Further, the pad area is divided into a first pad unit and a second pad unit. The first pad unit includes at least two first pads formed in a first area separate from the display area, and is connected to the gate line. The second pad unit includes at least two second pads formed in a second area separate from the display area, and is connected to the data line. Furthermore, each of the first pads and the second pads include an oxide semiconductor layer formed on the buffer layer formed on the substrate, a lower insulation layer formed on the oxide semiconductor to partially or entirely overlap the oxide semiconductor layer, a line layer formed on the lower insulation layer, an upper insulation layer formed on the line layer, and a pad electrode formed on the upper insulation layer and connected to the line layer through a contact hole formed in the upper insulation layer.

According to the embodiment shown in FIGS. 7A, 7B, 7C, and 7D, the line layer may include a lower layer formed of a same material as that of a gate line, and an upper layer formed of a same material as that of a data line. Further, according to the embodiment shown in FIGS. 8 and 9, the line layer may have a single layer formed of a same material as the gate line or the data line. The pad electrode may be formed of a same material as that of the pixel electrode in the same process as forming the pixel electrode.

FIGS. 10A, 10B, 10C, 10D, 10E, and 10F are plane views illustrating pads at various stages of a process for forming the pad according to the embodiment of the present invention. FIGS. 10A to 10F are plane views illustrating a portion of a pad shown in FIG. 7A denoted by a reference numeral 790. With relation to the process, the detailed process has been described with reference to FIGS. 6A to 6D.

Figure 10A:
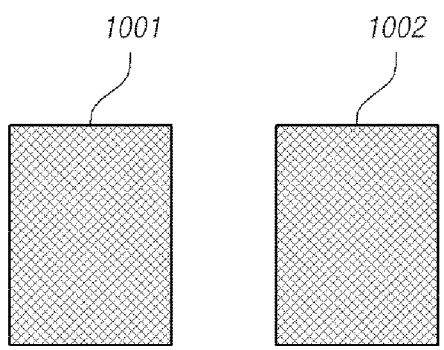
FIGS. 10A, 10B, 10C, 10D, 10E, and 10F are plane views illustrating processes of forming the pad according to the embodiment of the present invention.

FIG. 10A shows a partially formed pad after the process step of forming oxide semiconductor layers 1001 and 1002 on the substrate. The oxide semiconductor layer plays a role of an active layer in the display area. In FIG. 10A, an oxide semiconductor layer is formed in an area in which a pad is formed out of the display area, in a process of forming an active layer in the display area.

Figure 10B:
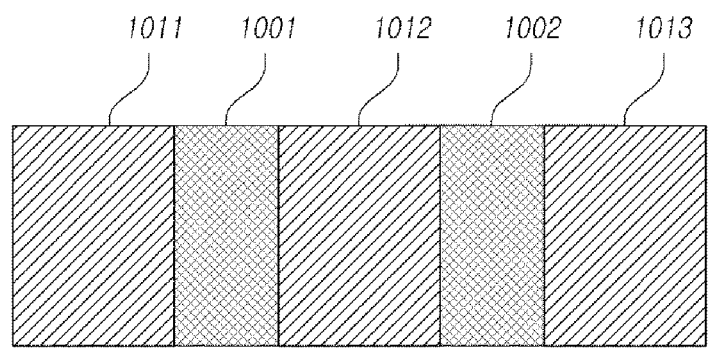

In FIG. 10B, a lower insulation layer and a first line layer are formed to partially overlap the oxide semiconductor layer. Reference numerals 1011, 1012, and 1013 indicate that the lower insulation layer overlaps the first line layer. The lower insulation layer indicated by the reference numerals 1011, 1012, and 1013 is formed in the same process as forming a gate insulation layer of a display area, and a first line layer is formed in a same process as forming a gate line of a display area.

Figure 10C:
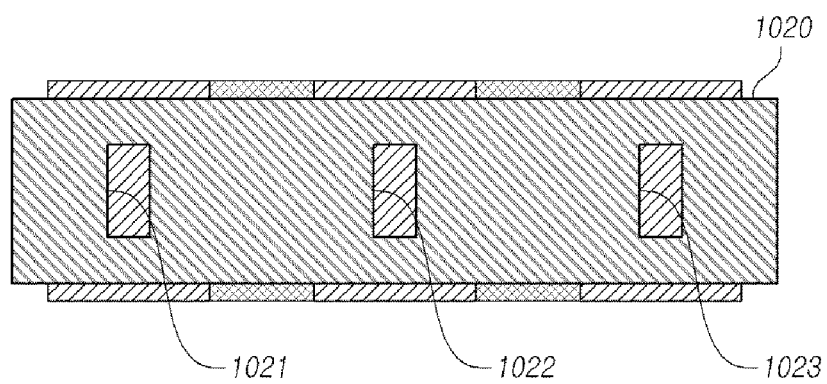

In FIG. 10C, a first upper insulation layer 1020 is formed on a first line layer, and is etched to form a contact hole. The first upper insulation layer 1020 is formed in the same process as forming an interlayer dielectric layer of the display area. Contact holes 1021, 1022, and 1023 are formed on the first upper insulation layer 1020 so that the first line layer is exposed.

Figure 10D:
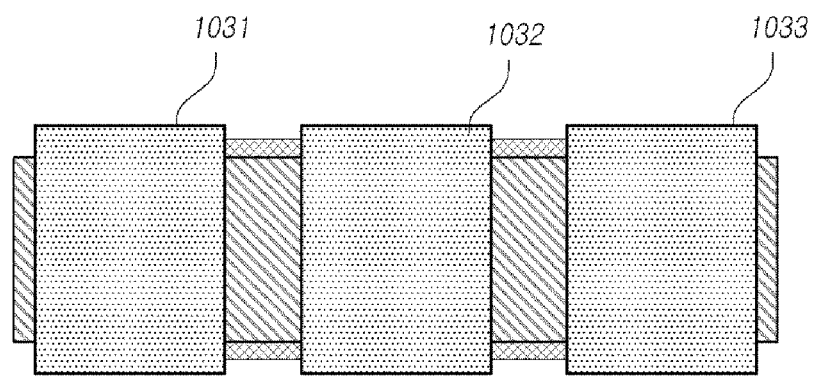

FIG. 10D shows second line layers 1031, 1032, and 1033 formed on the first upper insulation layer 1020. The second line layers 1031, 1032 and 1033 are formed in the same process as forming a data line of the display area. The second line layers 1031, 1032 and 1033 are connected to the first line layer through the contact holes 1021, 1022 and 1023 formed on the first upper insulation layer 1020 of FIG. 10C.

Figure 10E:
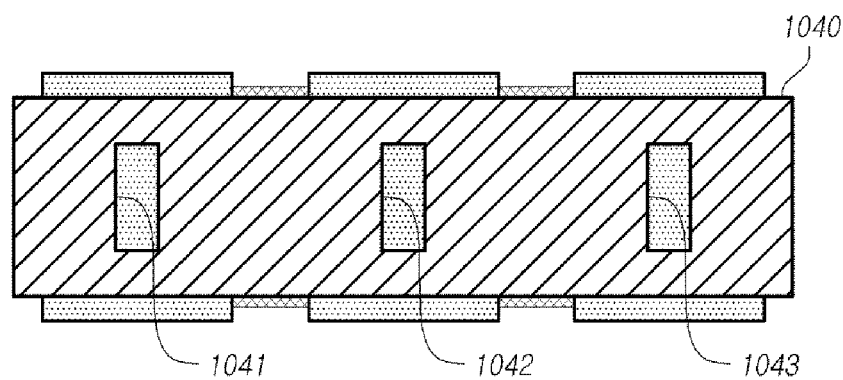

FIG. 10E shows a contact hole formed by etching the second upper insulation layer 1040 formed on the second line layers 1031, 1032, and 1033. The second upper insulation layer 1040 is formed in the same process as forming a planarization layer of the display area. Contact holes 1041, 1042, and 1043 are formed on the second upper insulation layer 1040 so that the second line layer is exposed.

Figure 10F:
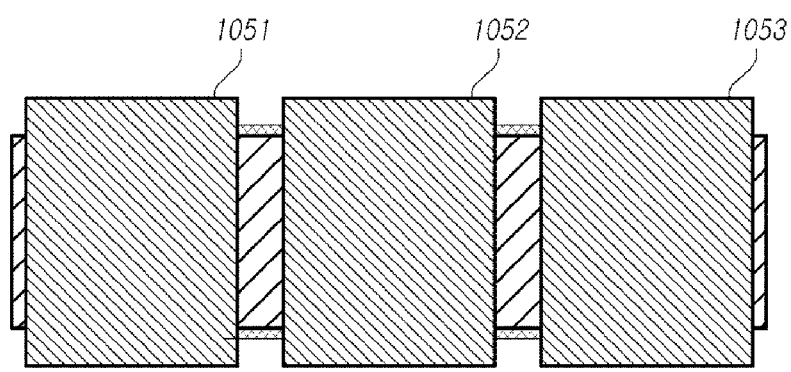

FIG. 10F shows a pad electrode formed on the second upper insulation layer. The pad electrodes 1051, 1052, and 1053 are formed in the same process as forming the pixel electrode of the display area. The pad electrode is connected to the second line layer through the contact holes 1041, 1042, and 1043 of the second upper insulation layer 1040 of FIG. 10E.

In one embodiment, a line layer may be formed to be a single layer, differently from the processes of FIGS. 10A to 10F. The process of forming the line layer regardless of a structure of a single layer/double layer will be described.

Figure 11:
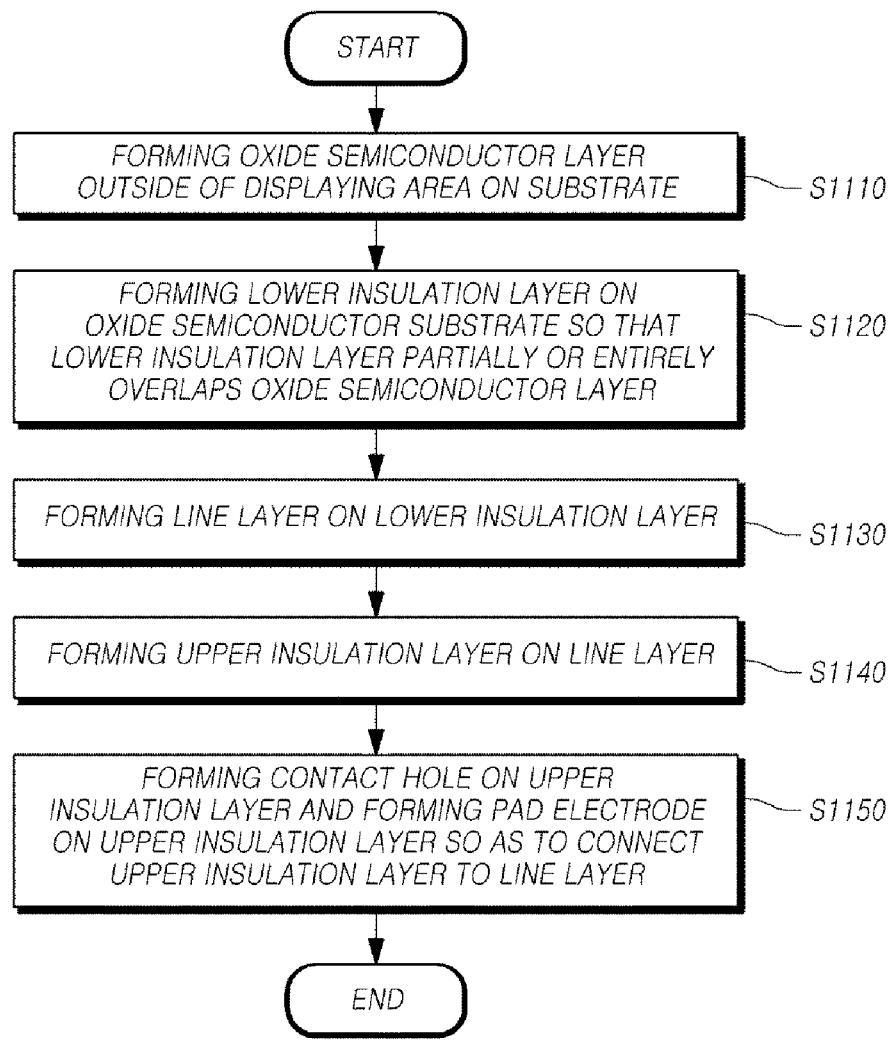
FIG. 11 is a flowchart illustrating a process of forming the oxide semiconductor layer on the pad to form a pad electrode.

FIG. 11 is a flowchart illustrating a process of forming the oxide semiconductor layer on the pad to form a pad electrode.

The process of forming the thin film transistor in the display area on the substrate is performed along with the process of forming the pad electrode in the pad area. First, the buffer layer is formed out of the display area on the substrate, and the oxide semiconductor layer is formed on the buffer layer in step S1110. A lower insulation layer is formed on the oxide semiconductor layer to partially, or wholly, overlap the formed oxide semiconductor layer in step S1120. The line layer is formed on the lower insulation layer in step S1130, and the line layer may be configured to be a single layer or a double layer. In the case that the line layer is formed to be a single layer, any one process of the gate line process or the data line process is applied. In the case that line layer is formed to be a double layer, in the gate line process and the data line process, the line layer may be formed to be a double layer. Then, an upper insulation layer is formed on the line layer in step S1140, and various configurations of the upper insulation layer of FIGS. 7A to 9 according to the configuration of the line layer will be described with reference to FIGS. 7A to 9. Then, a contact hole is formed in the upper insulation layer to form a pad electrode on the upper insulation layer so that the pad electrode is connected to the line layer in step S1150. The pad electrode may be formed of a same material as that of the pixel electrode in the same process as forming the pixel electrode.

The embodiments disclosed in the description may be applied to a field in which all thin film transistors to which the oxide semiconductor is applied are used, and further, as an example, the embodiments may be applied to a coplanar structure of a top gate but is not limited thereto. Further, if the lower insulation layer formed on the pad in the completed process is a gate insulation layer, the gate insulation layer may be present under the line layer. Further, a pattern of the oxide semiconductor between the pads according to the embodiment may have a size of 1 um×1 um. The pattern of the oxide semiconductor may be applied to all patterns separated from the pattern connected between the pads.

If the embodiment of the present invention described above is applied, a junction resistance of the pad is stabilized and a likelihood of a defect in the display device may be reduced, thereby improving production yield of the display device. Further, since the heating and the thermalization may be prevented, luminance of the display device can be improved through a decrease of temperature.

According to the present invention, as described above, there is an advantage in providing the display panel 110 and the display device 100, in which the pad is formed.

Further, according to the present invention, there is an advantage in providing the display panel 110 and the display device 100 in which the oxide semiconductor layer is formed to reduce a gap between the buffer layer and the insulation layer, which are laminated on the pad.

Further, according to the present invention, there is an advantage in preventing the heating and the thermalization of the pad.

Although exemplary embodiments of the present invention have been described for illustrative purposes, those skilled in the art will appreciate that various modifications, additions and substitutions are possible, without departing from the scope and spirit of the invention as disclosed in the accompanying claims. Therefore, the exemplary embodiments of the present invention disclosed herein are intended to illustrate the scope of the technical idea of the present invention, and the scope of the present invention is not limited by the exemplary embodiments. The scope of the present invention shall be construed on the basis of the accompanying claims in such a manner that all of the technical ideas included within the scope equivalent to the claims belong to the present invention.

What is claimed is:

1. A pad for a display device comprising a display area and a pad area, the pad to connect a gate line and a data line from one or more drivers to display elements in the pixel area, the pad comprising:
   an oxide semiconductor layer formed on a substrate;
   a lower insulation layer formed on the oxide semiconductor layer to at least partially overlap the oxide semiconductor layer;
   one or more line layers formed on the lower insulation layer;

an upper insulation layer formed on the one or more line layers; and a pad electrode formed on the upper insulation layer and connected to the one of the one or more line layers through a contact hole formed in the upper insulation layer.

2. The pad of claim 1, further comprising:
a buffer layer on which the oxide semiconductor layer is formed.

3. The pad of claim 1, wherein the oxide semiconductor comprises at least one of a Zinc oxide (ZnO) semiconductor, an Indium Zinc oxide (IZO) semiconductor, an Indium Aluminum Zinc oxide (IAZO) semiconductor, an Indium Gallium Zinc oxide (IGZO) semiconductor, and an Indium Tin Zinc oxide (ITZO) semiconductor.

4. The pad of claim 1, wherein the one or more line layers includes:
a lower layer formed of a same material as the gate line; and
an upper layer formed over the lower layer, the upper layer formed of a same material as the data line.

5. The pad of claim 1, wherein the one or more line layers comprises a single layer formed of a same material as a gate line or a data line coupled to the pad.

6. The pad of claim 1, wherein the pad electrode is formed of a same material as a pixel electrode in the pixel area of the display device.

7. A display device comprising:
a display area in which a pixel area is defined on a substrate by an intersection of a gate line transferring a gate signal, and a data line transferring a data signal, the pixel area comprising a pixel electrode;
a first pad unit including at least two first pads formed in a first area of the display area, each of the at least two first pads connected to the gate line; and
a second pad unit including at least two second pads formed in a second area of the display area, each of the at least two second pads connected to the data line,
wherein at least one of the first and second pad units includes a pad electrode formed of a same material as the pixel electrode, and
wherein an oxide semiconductor layer is formed over an area of the substrate laterally between the at least two first pads or the at least two second pads.

8. The display device as claimed in claim 7, wherein the oxide semiconductor layer over the area of the substrate laterally between the at least two first pads or the at least two first pads comprises two or more discrete non-contacting portions of the oxide semiconductor layer.

9. The display device as claimed in claim 7, further comprising:
a lower insulation layer formed on the oxide semiconductor layer and at least partially overlapping the oxide semiconductor layer;
one or more line layers formed on the lower insulation layer;
an upper insulation layer formed on the one or more line layers; and
a pad electrode formed on the upper insulation layer and connected to one of the one or more line layers through a contact hole formed in the upper insulation layer.

10. The display device of claim 9, wherein the one or more line layers comprises:
a lower layer formed of a same material as the gate line; and
an upper layer formed of a same material as the data line.

11. The display device of claim 9, wherein the one or more line layers comprises a single layer formed of a same material as the gate line or the data line.

12. The display device of claim 7, further comprising:
a buffer layer formed on the substrate, wherein the oxide semiconductor layer is formed on the buffer layer.

13. The display device of claim 7, wherein the oxide semiconductor comprises at least one of a Zinc oxide (ZnO) semiconductor, an Indium Zinc oxide (IZO) semiconductor, an Indium Aluminum Zinc oxide (IAZO) semiconductor, an Indium Gallium Zinc oxide (IGZO) semiconductor, and an Indium Tin Zinc oxide (ITZO) semiconductor.

14. A method of fabricating a pad of a display device, the pad to connect a gate line and a data line from one or more drivers to display elements in a pixel area of the display device, the method comprising:
forming an oxide semiconductor layer over a substrate;
forming a lower insulation layer on the oxide semiconductor layer to at least partially overlap the oxide semiconductor layer;
forming one or more line layers on the lower insulation layer;
forming an upper insulation layer on the one or more line layer;
forming a contact hole through the upper insulation layer; and
forming a pad electrode on the upper insulation layer so that the pad electrode is connected to one of the one or more line layers through the contact hole.

15. The method as claimed in claim 14, further comprising:
forming a buffer layer on the substrate before forming the oxide semiconductor layer, wherein the oxide semiconductor layer is formed on the buffer layer.

16. The method as claimed in claim 14, wherein the oxide semiconductor comprises at least one of a Zinc oxide (ZnO) semiconductor, an Indium Zinc oxide (IZO) semiconductor, an Indium Aluminum Zinc oxide (IAZO) semiconductor, an Indium Gallium Zinc oxide (IGZO) semiconductor, and an Indium Tin Zinc oxide (ITZO) semiconductor.

17. The method as claimed in claim 14, wherein forming the one or more line layers includes:
forming a lower layer on the lower insulation layer, the lower layer formed of a same material as the gate line of the display device; and
forming an upper layer over the lower layer, the upper layer formed of a same material as the data line of the display device.

18. The method of claim 14, wherein forming the one or more line layer includes:
forming a single layer of a same material as the gate line or data line of the display device.

19. The method as claimed in claim 16, wherein forming the pad electrode comprises:
forming the pad electrode of a same material as a pixel electrode of the display device.

20. A display device comprising:
a substrate;
a buffer layer formed over the substrate;
a plurality of pixel layers formed in a pixel area over a first portion of the buffer layer, the plurality of pixel layers including:
an active layer formed on the buffer layer in the pixel area;
a gate insulation layer formed on the active layer in the pixel area;
an interlayer dielectric layer formed on a gate line in the pixel area;
a source/drain layer connected with a data line formed on the interlayer dielectric layer in the pixel area;

a planarization layer formed on the source/drain layer in the pixel area; and a pixel electrode formed on the planarization layer in the pixel area;

a plurality of pad layers formed in a pad area over a second portion of the buffer layer, the plurality of pad layers including:

an oxide semiconductor layer formed on the buffer layer in the pad area, the oxide semiconductor layer formed of a same material as the active layer;

a data line layer formed over the oxide semiconductor layer in the pad area, the data line layer formed of a same material as the data line;

an upper insulation layer formed over the data line layer in the pad area, the upper insulation layer formed of a same material as the planarization layer; and a pad electrode formed on the third insulation layer in the pad area, the pad electrode formed of a same material as the pixel electrode.

21. The display device of claim 20, wherein the plurality of pad layers further comprises:

a lower insulation layer formed on the oxide semiconductor layer, the lower insulation formed of a same material as the gate insulation layer;

a gate line layer formed on the lower insulation layer in the pad area, the gate line layer formed of a same material as the gate line; and an intermediate insulation layer formed on the gate line layer, the intermediate insulation layer formed from the same material as the interlayer dielectric layer, wherein the data line layer is formed on the intermediate insulation layer and wherein the upper insulation layer is formed on the data line layer.

22. The display device of claim 20, wherein the plurality of pad layers further comprises:

a lower insulation layer formed on the oxide semiconductor layer, the lower insulation formed of a same material as the gate insulation layer, wherein the data line layer is formed on the lower insulation layer;

an intermediate insulation layer formed on the data line layer, the intermediate insulation layer formed from the same material as the interlayer dielectric layer, wherein the upper insulation layer is formed on the intermediate insulation layer.

23. The display device of claim 20, wherein the plurality of pad layers further comprises:

a lower insulation layer formed on the oxide semiconductor layer, the lower insulation formed of a same material as the interlayer dielectric layer, wherein the data line layer is formed on the lower insulation layer and wherein the upper insulation layer is formed on the data line layer.

24. The display device of claim 23, wherein the oxide semiconductor layer comprises a plurality of discrete non-contacting portions having a gap between them under the data line layer, the gap filled by the lower insulation layer.

25. The display device of claim 20, wherein the oxide semiconductor layer extends laterally into an area between adjacent pads in the pad area.

26. The display device of claim 20, wherein the oxide semiconductor layer is structured such that a gap in the oxide semiconductor layer exists between in the area laterally between two adjacent pads, the gap filled with an insulation layer.

* * * * *